(12) United States Patent
Stenson et al.

(10) Patent No.: US 12,099,783 B2
(45) Date of Patent: Sep. 24, 2024

(54) ACCURACY OF SIMULATIONS FOR OBJECT IDENTIFICATIONS

(71) Applicant: GM Cruise Holdings LLC, San Francisco, CA (US)

(72) Inventors: Richard Stenson, San Mateo, CA (US); Joel Gross, San Francisco, CA (US)

(73) Assignee: GM Cruise Holdings LLC, San Francisco, CA (US)

( * ) Notice: Subject to any disclaimer, the term of this patent is extended or adjusted under 35 U.S.C. 154(b) by 713 days.

(21) Appl. No.: 17/234,248

(22) Filed: Apr. 19, 2021

(65) Prior Publication Data

US 2022/0335178 A1    Oct. 20, 2022

(51) Int. Cl.
*G06F 30/20* (2020.01)
*G01S 17/88* (2006.01)

(52) U.S. Cl.
CPC .............. *G06F 30/20* (2020.01); *G01S 17/88* (2013.01)

(58) Field of Classification Search
CPC ...................................................... G06F 30/20
USPC ............................................................ 703/13
See application file for complete search history.

(56) References Cited

U.S. PATENT DOCUMENTS

| | | | |
|---|---|---|---|
| 9,836,895 B1 * | 12/2017 | Nygaard | G07C 5/0841 |
| 11,334,762 B1 * | 5/2022 | Wrenninge | G06V 10/774 |
| 2002/0058309 A1 * | 5/2002 | Baker | C07H 21/04 |
| | | | 435/254.2 |

* cited by examiner

*Primary Examiner* — Brian S Cook

(57) ABSTRACT

A computer-implemented method is provided for simulating sensor data acquisition. The method may include receiving simulated sensor data corresponding with a synthetic object in a simulated three-dimensional (3D) environment. The method may also include identifying an object type corresponding with the synthetic object based on a location of the synthetic object in the simulated 3D environment. The method may further include associating an intensity value with the simulated sensor data based on the object type for the synthetic object.

20 Claims, 7 Drawing Sheets

ACCURACY OF SIMULATIONS FOR OBJECT IDENTIFICATIONS

TECHNICAL FIELD

The subject technology provides solutions for improving the accuracy of Light Detection and Ranging (LiDAR) simulations for object identifications.

BACKGROUND

An autonomous vehicle is a motorized vehicle that can navigate without a human driver. An exemplary autonomous vehicle includes a plurality of sensor systems, such as, but not limited to, a camera sensor system, a Light Detection and Ranging (LiDAR) sensor system, a radar sensor system, amongst others, wherein the autonomous vehicle operates based upon sensor signals output by the sensor systems. Specifically, the sensor signals are provided to an internal computing system in communication with the plurality of sensor systems, wherein a processor executes instructions based upon the sensor signals to control a mechanical system of the autonomous vehicle, such as a vehicle propulsion system, a braking system, or a steering system.

Computer simulations from cameras and LiDAR sensors have been developed to create a virtual world including synthetic objects and simulated road scenarios. The simulations can be used for machine learning of autonomous vehicles. Machine learning algorithms or models can be trained to identify objects based upon the computer simulations including LiDAR simulations. However, the accuracy of the identification of the synthetic objects based upon the machine learning algorithms or models is not as high as desired. There remains a need for improving accuracy of LiDAR simulations for object identifications.

BRIEF SUMMARY

In one aspect, a computer-implemented method is provided for simulating sensor data acquisition. The method may include receiving simulated sensor data corresponding with a first synthetic object in a simulated three-dimensional (3D) environment. The method may also include identifying an object type corresponding with the first synthetic object based on a location of the first synthetic object in the simulated 3D environment. The method may further include associating a first intensity value with the simulated sensor data based on the object type for the first synthetic object.

In another aspect, a non-transitory computer readable medium may include instructions. The instructions, when executed by a computing system, cause the computing system to perform operations that may include receiving simulated sensor data corresponding with a first synthetic object in a simulated three-dimensional environment, identifying an object type correspond with the first synthetic object based on a location of the first synthetic object in the simulated 3D environment, and associating a first intensity value with the simulated sensor data based on the object type for the first synthetic object.

In another aspect, a system for simulating sensor data acquisition may include one or more processors and a non-transitory computer readable medium comprising instructions stored therein. The instructions, when executed by the one or more processors, cause the processors perform operations that may include receiving simulated sensor data corresponding with a first synthetic object in a simulated three-dimensional environment, identifying an object type correspond with the first synthetic object based on a location of the first synthetic object in the simulated 3D environment, and associating a first intensity value with the simulated sensor data based on the object type for the first synthetic object.

Additional aspects, embodiments, and features are set forth in part in the description that follows, and will become apparent to those skilled in the art upon examination of the specification or may be learned by the practice of the disclosed subject matter. A further understanding of the nature and advantages of the disclosure may be realized by reference to the remaining portions of the specification and the drawings, which forms a part of this disclosure.

BRIEF DESCRIPTION OF THE DRAWINGS

The above-recited and other advantages and features of the present technology will become apparent by reference to specific implementations illustrated in the appended drawings. A person of ordinary skill in the art will understand that these drawings only show some examples of the present technology and would not limit the scope of the present technology to these examples. Furthermore, the skilled artisan will appreciate the principles of the present technology as described and explained with additional specificity and detail through the use of the accompanying drawings in which.

DETAILED DESCRIPTION

Figure 1:
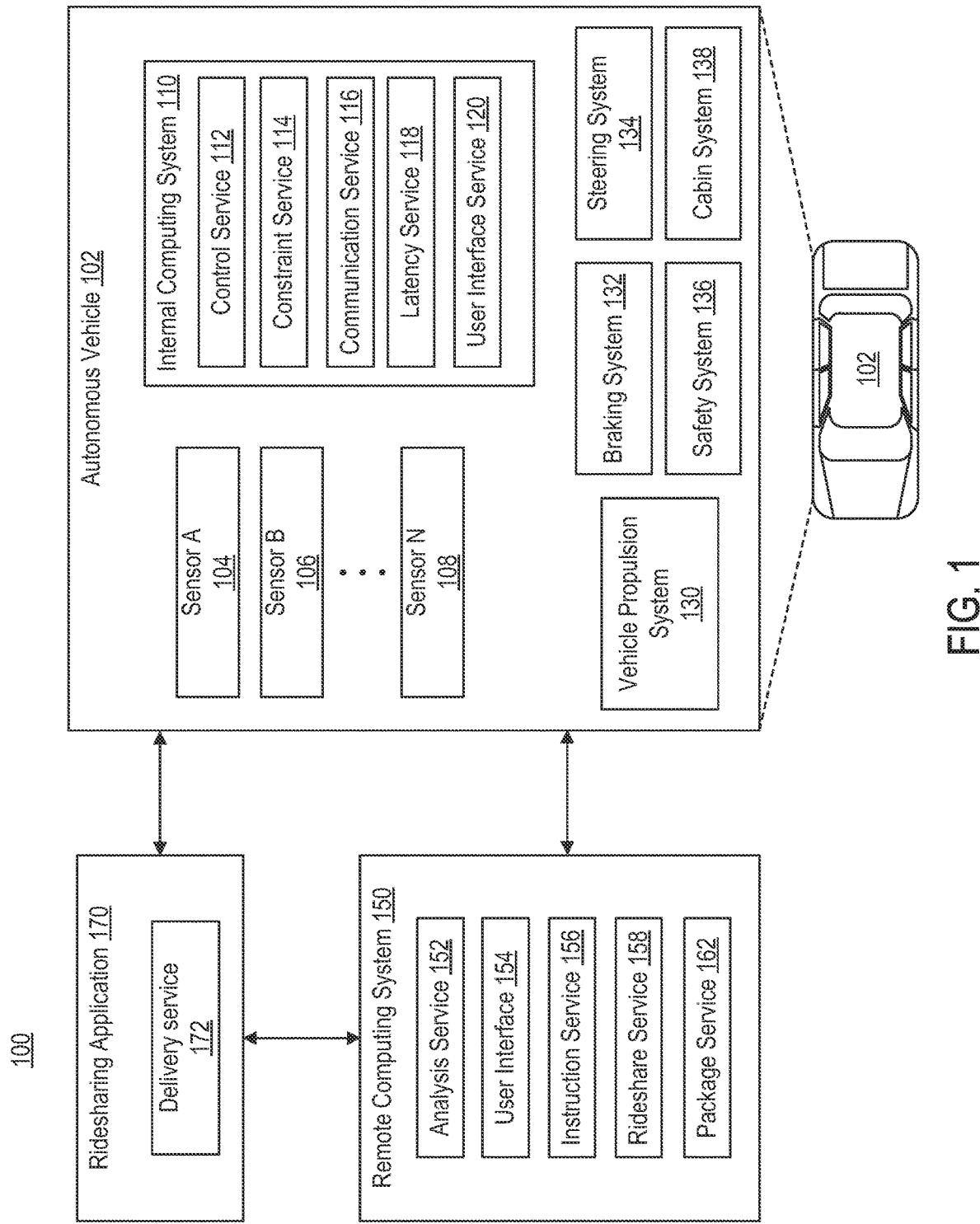
FIG. 1 illustrates an example environment that includes an autonomous vehicle in communication with a remote computing system, according to some aspects of the disclosed technology.

Various examples of the present technology are discussed in detail below. While specific implementations are discussed, it should be understood that this is done for illustration purposes only. A person skilled in the relevant art will recognize that other components and configurations may be used without parting from the spirit and scope of the present technology. In some instances, well-known structures and devices are shown in block diagram form in order to facilitate describing one or more aspects. Further, it is to be understood that functionality that is described as being carried out by certain system components may be performed by more or fewer components than shown.

The disclosed technology addresses a need in the art for improving the accuracy of LiDAR simulations, for example, that can help identify synthetic objects (e.g. vehicles) using machine learning algorithms. The disclosure provides a computer-implemented method for simulating sensor data acquisition. The method includes receiving simulated sensor data corresponding with synthetic objects in a simulated three-dimensional (3D) environment. The method also includes identifying object types corresponding with the synthetic objects based on locations of the synthetic objects in the simulated 3D environment. The method further includes associating intensity values with the simulated sensor data based on the object types for the synthetic objects. The synthetic objects are simulated objects.

The disclosed technology uses simulated light intensity signals returned from synthetic objects (e.g. simulated vehicles) to help identify the synthetic objects more accurately. By simulating light intensity values for synthetic LiDAR data or simulated LiDAR data, the simulation can more closely resemble LiDAR data that are collected in real-world driving scenarios. As such, varying intensity values for returned synthetic LiDAR signals can be used to improve object classification performed in a synthetic environment or a simulated environment.

Returned synthetic intensity values can be varied depending on a variety of characteristics, including but not limited to: synthetic object type, synthetic object orientation, angle of incidence and/or properties of individual components or parts of the synthetic objects. For example, different components or parts may be formed of various materials, each of which may have different optical reflectivity properties. For example, if the synthetic object is a vehicle, various component parts can include windows, a body frame, tires, seats inside the vehicle, tail lights and head light (e.g., retroreflectors), among others. For real world vehicles, the windows of the vehicle are normally formed of a glass, which is optically transparent and would results in low (e.g. nearly zero) returned light intensity values. In contrast, the tail lights or front lights of the vehicle, which can include retro-reflectors, have relatively high returned light intensity values. Other reflectors and license plates on vehicles, motorcycles, and bikes may also have high returned light intensity values. Similarly, other vehicle parts are typically associated with varying returned light intensity values, such as the body frame of the vehicle is normally formed of a metal, the tires of the vehicle are normally formed of dark rubbers, and the seats inside the vehicle, which can have leather or fabrics covers. As discussed in further detail below, by mimicking real-world returned light intensity values in synthetic LiDAR data, the accuracy of various object (e.g. vehicle) classification processes, such as those preformed using one or more machine-learning models, can be greatly improved.

In some aspects, the identifications of the synthetic objects combine the simulated light intensity signals returned from the synthetic objects with locations where the light signals are reflected. For example, the synthetic object is a vehicle. The light can transmit through windows of the vehicle and reflected from the seats of the vehicle and returned back to the simulated LiDAR sensors. The low intensity returned from the seats of the vehicle in combination with the locations of the seats would further help identify the vehicle.

In some aspects, the reflectivity may also vary with color, surface smoothness or roughness of the synthetic objects. The LiDAR simulations can incorporate variations based upon these factors.

FIG. 1 illustrates environment 100 that includes an autonomous vehicle 102 in communication with a computing system 150.

The autonomous vehicle 102 can navigate about roadways without a human driver based upon sensor signals output by sensor systems 104-106 of the autonomous vehicle 102. The autonomous vehicle 102 includes a plurality of sensor systems 104-106 (a first sensor system 102 through an Nth sensor system 104). The sensor systems 104-106 are of different types and are arranged about the autonomous vehicle 102. For example, the first sensor system 104 may be a camera sensor system and the Nth sensor system 106 may be a LiDAR sensor system. Other exemplary sensor systems include radar sensor systems, global positioning system (GPS) sensor systems, inertial measurement units (IMU), infrared sensor systems, laser sensor systems, sonar sensor systems, and the like.

The autonomous vehicle 102 further includes several mechanical systems that are used to effectuate appropriate motion of the autonomous vehicle 102. For instance, the mechanical systems can include but are not limited to, a vehicle propulsion system 130, a braking system 132, and a steering system 134. The vehicle propulsion system 130 may include an electric motor, an internal combustion engine, or both. The braking system 132 can include an engine brake, brake pads, actuators, and/or any other suitable componentry that is configured to assist in decelerating the autonomous vehicle 102. The steering system 134 includes suitable componentry that is configured to control the direction of movement of the autonomous vehicle 102 during navigation.

The autonomous vehicle 102 further includes a safety system 136 that can include various lights and signal indicators, parking brake, airbags, etc. The autonomous vehicle 102 further includes a cabin system 138 that can include cabin temperature control systems, in-cabin entertainment systems, etc.

The autonomous vehicle 102 additionally includes an internal computing system 110 that is in communication with the sensor systems 104-106 and the mechanical systems 130, 132, 134. The internal computing system includes at least one processor and at least one memory having computer-executable instructions that are executed by the processor. The computer-executable instructions can make up one or more services responsible for controlling the autonomous vehicle 102, communicating with remote computing system 150, receiving inputs from passengers or human co-pilots, logging metrics regarding data collected by sensor systems 104-106 and human co-pilots, etc.

The internal computing system 110 can include a control service 112 that is configured to control operation of the vehicle propulsion system 206, the braking system 208, the steering system 210, the safety system 136, and the cabin system 138. The control service 112 receives sensor signals from the sensor systems 202-204 as well communicates with other services of the internal computing system 110 to effectuate operation of the autonomous vehicle 102. In some embodiments, control service 112 may carry out operations in concert one or more other systems of autonomous vehicle 102.

The internal computing system 110 can also include a constraint service 114 to facilitate safe propulsion of the autonomous vehicle 102. The constraint service 116 includes instructions for activating a constraint based on a rule-based restriction upon operation of the autonomous vehicle 102. For example, the constraint may be a restriction upon navigation that is activated in accordance with protocols configured to avoid occupying the same space as other objects, abide by traffic laws, circumvent avoidance areas, etc. In some embodiments, the constraint service can be part of the control service 112

The internal computing system 110 can also include a communication service 116. The communication service can include both software and hardware elements for transmitting and receiving signals from/to the remote computing system 250. The communication service 116 is configured to transmit information wirelessly over a network, for example, through an antenna array that provides personal cellular (long-term evolution (LTE), 3G, 5G, etc.) communication.

In some embodiments, one or more services of the internal computing system 110 are configured to send and receive communications to remote computing system 150 for such reasons as reporting data for training and evaluating machine learning algorithms, requesting assistance from remoting computing system or a human operator via remote computing system, software service updates, ridesharing pickup and drop off instructions etc.

The internal computing system 110 can also include a latency service 118. The latency service 118 can utilize timestamps on communications to and from the remote computing system 150 to determine if a communication has been received from the remote computing system 150 in time to be useful. For example, when a service of the internal computing system 110 requests feedback from remote computing system 150 on a time-sensitive process, the latency service 118 can determine if a response was timely received from remote computing system 150 as information can quickly become too stale to be actionable. When the latency service 118 determines that a response has not been received within a threshold, the latency service 118 can enable other systems of autonomous vehicle 102 or a passenger to make necessary decisions or to provide the needed feedback.

The internal computing system 110 can also include a user interface service 120 that can communicate with cabin system 138 in order to provide information or receive information to a human co-pilot or human passenger. In some embodiments, a human co-pilot or human passenger may be required to evaluate and override a constraint from constraint service 114, or the human co-pilot or human passenger may wish to provide an instruction to the autonomous vehicle 102 regarding destinations, requested routes, or other requested operations.

As described above, the remote computing system 150 is configured to send/receive a signal from the autonomous vehicle 140 regarding reporting data for training and evaluating machine learning algorithms, requesting assistance from remoting computing system or a human operator via the remote computing system 150, software service updates, ridesharing pickup and drop off instructions, etc.

The remote computing system 150 includes an analysis service 152 that is configured to receive data from autonomous vehicle 102 and analyze the data to train or evaluate machine learning algorithms for operating the autonomous vehicle 102. The analysis service 152 can also perform analysis pertaining to data associated with one or more errors or constraints reported by autonomous vehicle 102.

The remote computing system 150 can also include a user interface service 154 configured to present metrics, video, pictures, sounds reported from the autonomous vehicle 102 to an operator of remote computing system 150. User interface service 154 can further receive input instructions from an operator that can be sent to the autonomous vehicle 102.

The remote computing system 150 can also include an instruction service 156 for sending instructions regarding the operation of the autonomous vehicle 102. For example, in response to an output of the analysis service 152 or user interface service 154, instructions service 156 can prepare instructions to one or more services of the autonomous vehicle 102 or a co-pilot or passenger of the autonomous vehicle 102.

The remote computing system 150 can also include a rideshare service 158 configured to interact with ridesharing applications 170 operating on (potential) passenger computing devices. The rideshare service 158 can receive requests to be picked up or dropped off from passenger ridesharing app 170 and can dispatch autonomous vehicle 102 for the trip. The rideshare service 158 can also act as an intermediary between the ridesharing app 170 and the autonomous vehicle wherein a passenger might provide instructions to the autonomous vehicle to 102 go around an obstacle, change routes, honk the horn, etc.

Figure 2:
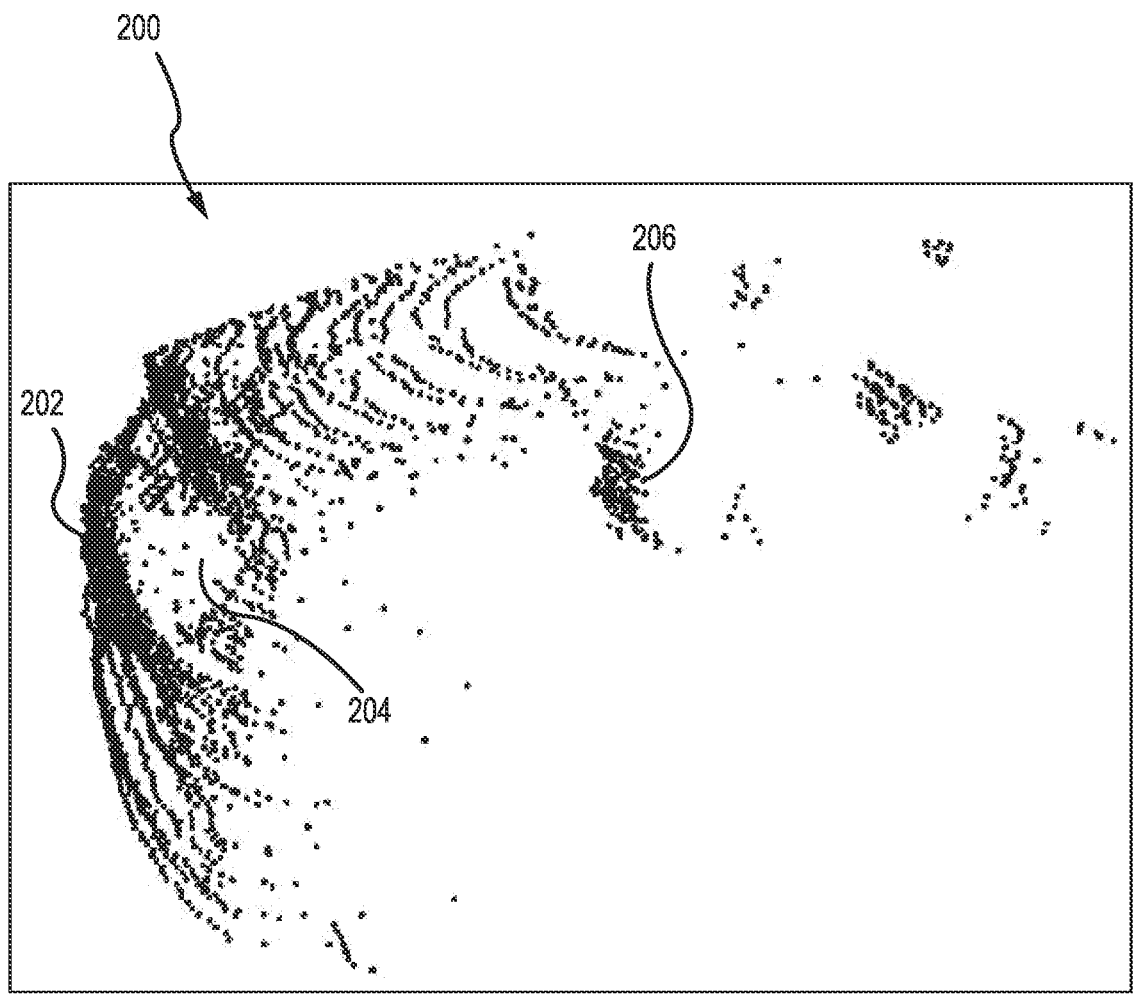
FIG. 2 illustrates an example raw LiDAR data represented as point clouds that represent a vehicle according to some aspects of the disclosed technology.

FIG. 2 illustrates an example of raw LiDAR data represented as point clouds that represent a vehicle, according to some aspects of the disclosed technology. As shown in FIG. 2, a point cloud 200 illustrates an example of LiDAR data points that correspond with a vehicle. Consistent with various vehicle features and reflective properties, some regions have more points than other regions. For example, a first region 202 with more points represents the body frame of the vehicle 200. A second region 204 with very few points is embedded within the first region 202 and represents a window of the vehicle. A third region 206 with more point clouds represents the seats of the vehicle inside the vehicle 200.

LiDAR simulations are developed by evaluating the raw LiDAR data from LiDAR sensors to create a virtual environment or a simulated environment including synthetic objects and simulated road scenarios. For example, the LiDAR simulations may replace real world objects and/or agents detected by LiDAR sensors with synthetic objects and/or simulated road actors. The LiDAR simulations may also be used to provide simulated road scenarios, which may include various streets, intersections, turning points, various slopes of the streets, and/or narrow or wide streets, among others. The synthetic objects may include vehicles, pedestrians, bikes, bushes, among others. The synthetic objects may also include people riding various personal vehicles, such as like scooters, skateboards, electric unicycles, one wheels, wheel chairs, among others. The synthetic objects may further include people walking dogs.

Figure 3:
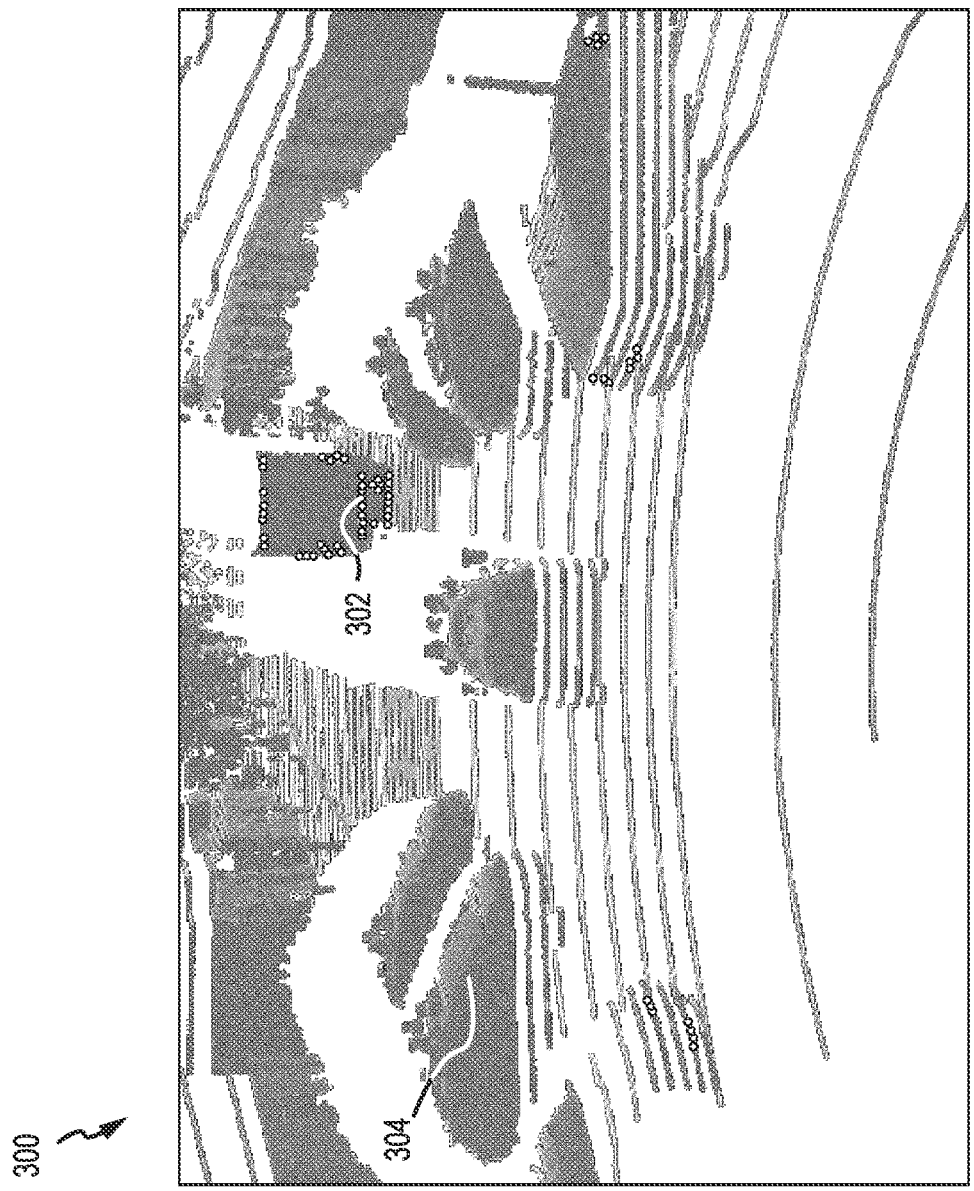
FIG. 3 illustrates an example LiDAR simulation without simulated light intensities returned from a number of vehicles according to some aspects of the disclosed technology.

FIG. 3 illustrates an example of simulated LiDAR data, without simulated light intensities, according to some aspects of the disclosed technology. The example LiDAR simulation without simulated light intensities 300 shows a black and white image that was converted from an original color image. The simulation 300 includes some circled white spots 302 that may represent simulated head lights and tail lights and body frame of a vehicle. The circled spots 302 were in red color in the original color image. The simulation 300 also includes dark solid regions 304, which were in blue color in the color image before the conversion into the black and white image. The dark solid region 304 represents a window and a body frame, which could not be distinguished in the solid region. The simulation 300 did not provide realistic look for the window of the vehicle. In such simulations, returned light intensity information was not used to perform object identification.

Particular object characteristics, such as known body frame geometries, may help identify a synthetic object as a vehicle. However, without the benefit of returned light intensity information, object classifications have a limited accuracy (e.g., with about 50%-60% probability of correct classification). In some instances, additional feature characteristics, such as tail lights and head lights, may further help identify the object as a vehicle to have a better accuracy, e.g. about 85% accuracy. However, without returned light intensity information, vehicle windows cannot be accurately represented. In the example illustrated by FIG. 3, the windows of the vehicle are viewed in as solid shapes, and there are no discernable differences between the vehicles, e.g. between the windows and the body frame of the vehicle.

Figure 4:
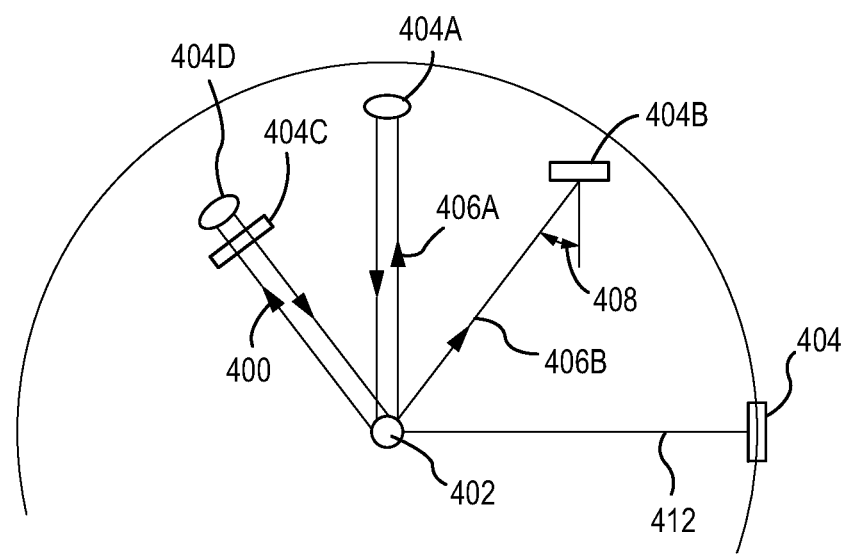
FIG. 4 illustrates an example of simulated light rays from LiDAR sensors directed toward objects and reflected back to the LiDAR sensors according to some aspects of the disclosed technology.

FIG. 4 illustrates an example of simulated light rays from simulated LiDAR sensors directed toward objects and reflected back to the LiDAR sensors, according to some aspects of the disclosed technology. The simulated LiDAR sensors can be configured to simulate operations that are performed by real-world sensors. For example, the simulated LiDAR sensors can be used to simulate the transmission of light and corresponding detection oft returned signals reflected from various synthetic objects in the simulated environment. The returned signals may include returned signals 406A and 406B from corresponding objects 404A and 404B. As shown in FIG. 4, the returned signal 406A from the object 404A is a primary reflection and has a zero incident angle.

The returned signal intensity values may vary based on an angle for the incident beam. For example, the intensity may be reduced based upon the angle. As shown in FIG. 4, the returned signal 406B from the object 404B is also a primary reflection and has an angle 408 greater than zero. The returned signal 406B reflected off the object 404B and back to sensors 402 has the same angle as that for the incident beam.

The returned signals may also include returned signal 410 from objects. For example, a light signal may be transmitted through an optically semi-transparent or transparent object 404C and returned signal 410 may be reflected from another object 404D behind the semitransparent or transparent object 404C or at a further distance from the sensors 402. The reflections after transmission through a first object and reflected from a second object behind the first object are referred to secondary reflections.

Further, LiDAR signals may be collected from any other objects 404 within a distance 412 from the sensors 402. When the distance 412 increases, the returned light intensities decrease. In some embodiments, the distance 412 may be 2 meters or less.

Figure 5:
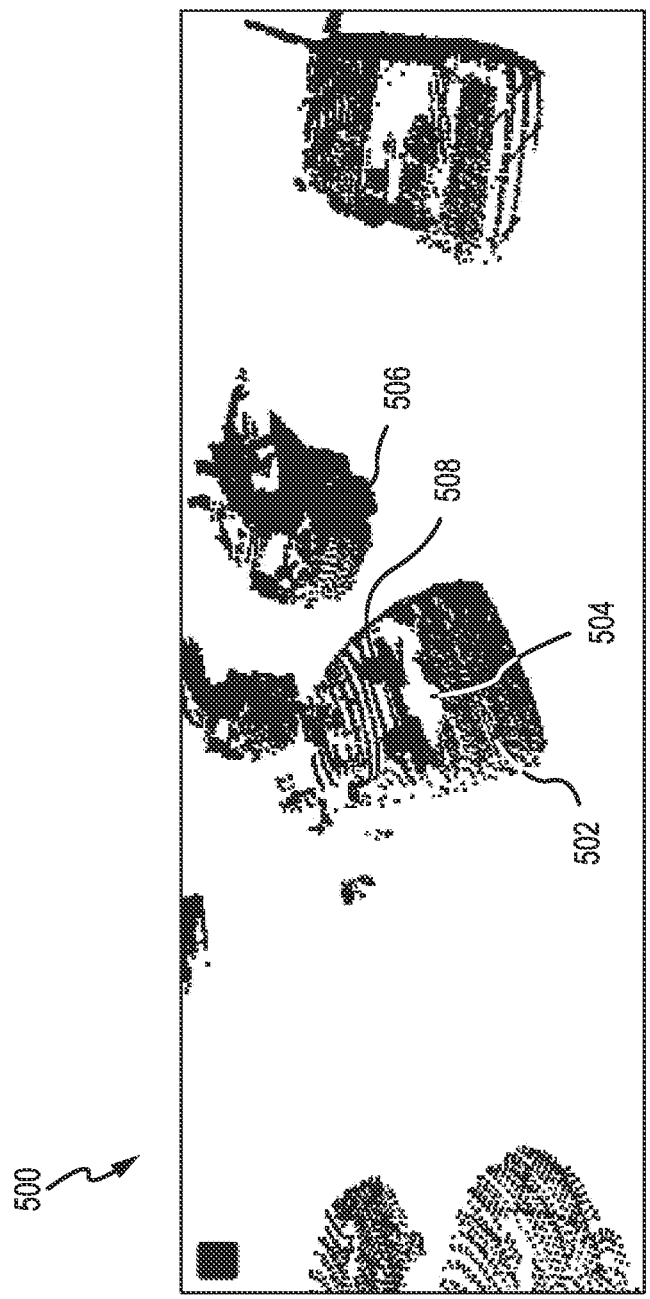
FIG. 5 illustrates an example LiDAR simulation including simulated light intensities returned from a number of vehicles according to some aspects of the disclosed technology.

With the introduction of the simulated intensities returned from the synthetic objects, the simulation can provide a more realistic look of the vehicles. FIG. 5 illustrates an example LiDAR simulation including simulated light intensities returned from a number of vehicles according to some aspects of the disclosed technology. As shown in FIG. 5, the LiDAR simulation 500 includes dark patterns 502 showing body frames of the vehicles. The simulation 500 includes some light regions 504 embedded within the body frames 502. For example, the light regions 504 represents windows of the vehicles and provide a more realistic looking of the windows of the vehicles. Also, the simulation 500 includes some dark patterns 508 inside the body frame 502, which represent interior objects, such as vehicle seats. The simulation 500 also include some dark region 506 near the bottom of the vehicle, which represents the tire of the vehicle. The simulation 500 includes cutouts that represent the windows of the vehicles, and also tires, and thus provides a more realistic look of the vehicles.

The simulation 500 combines the intensity signals returned and the locations where the intensity signals come from to identify the seats inside the vehicle. In this simulation, if an object is identified as a window, the points associated with the window are removed, and secondary light rays are sent from the simulated LiDAR sensors toward the window. Then, the secondary light rays transmit through the window and reflect back from the seats inside the vehicle and received by the simulated LiDAR sensors. The light intensities of the secondary reflections from inside the vehicle are lower than the light intensities reflected from the body frame outside the vehicle. The lower light intensity and the location help identify the seats in the simulation.

The points shown in FIG. 5 are close to the point clouds of the raw LiDAR data as shown in FIG. 2, and present realistic visualization of the vehicles. Also, the points shown in FIG. 5 are much more realistic than that shown in FIG. 3 of the LiDAR simulations without simulated intensity data. With the more realistic simulation 500, the accuracy for identifying objects as vehicles is improved in LiDAR simulation.

The LiDAR simulations may add light transmission for semi-transparent or transparent parts of a first synthetic object, such as windows of a vehicle, and detect the secondary reflections from a second synthetic object behind the semi-transparent or transparent part of the first synthetic object, such as seats behind the windows inside the vehicle.

In some aspects, the LiDAR simulations can be used for machine leaning algorithms used by autonomous vehicles. The machine learning algorithms can be trained to identity the type of synthetic objects, such as vehicles. In the example simulation for identification of vehicles with the simulated LiDAR signals including intensities, the accuracy for identification of the vehicles can be as high as 95%, which is enabled by the identification of the windows and seats inside the vehicle based upon the reflected intensities and the associated locations. In particular, the machine learning algorithms with the LiDAR simulations including returned intensity demonstrated about 95% correctness, which means that the machine leaning algorithms can identify about 95 vehicles among 100 vehicles.

In contrast, the accuracy for identification of the vehicle is 98% based upon actual LiDAR data, which means that based upon the collected LiDAR data in real time, one can identity about 98 vehicles among 100 vehicles, i.e. about 98% accuracy. As such, the LiDAR simulations with simulated intensities can result in about 3% difference from the real time LiDAR data.

Figure 6:
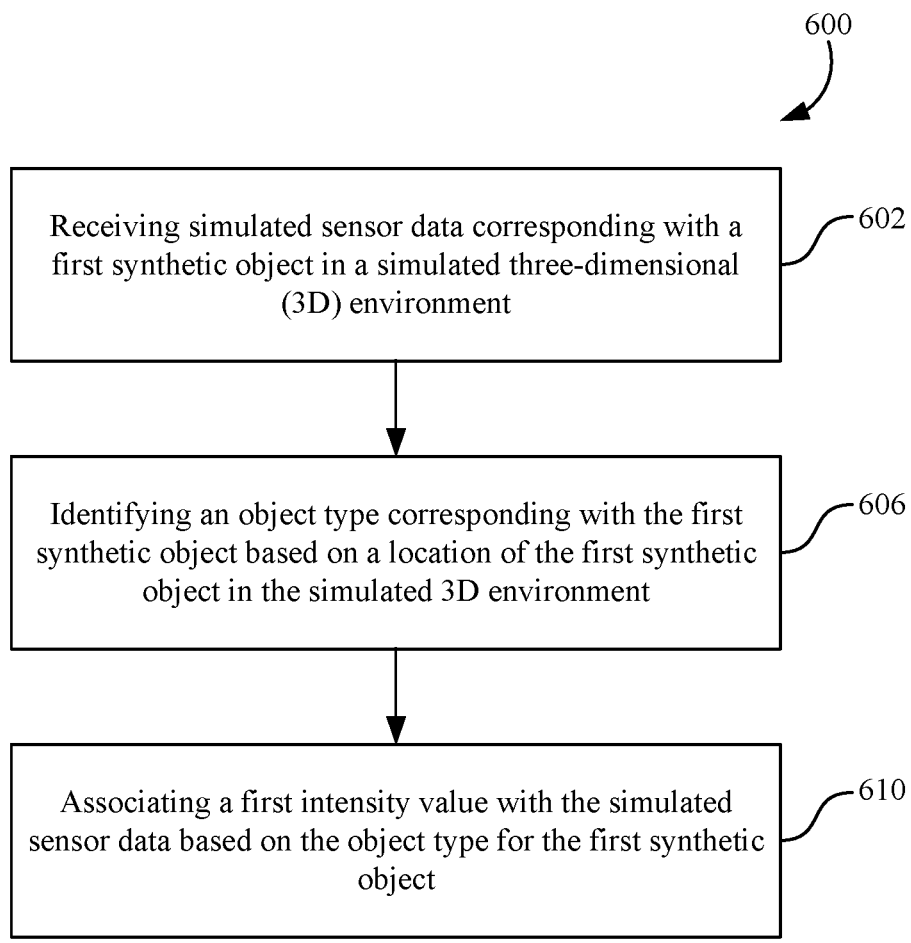
FIG. 6 is an example flow chart for simulating LiDAR sensor data acquisition according to some aspects of the disclosed technology.

FIG. 6 is an example flow chart for simulating LiDAR sensor data acquisition according to some aspects of the disclosed technology. A computer-implemented method 600 is provided for simulating sensor data acquisition. A simulation engine may include various software services made up of algorithms for performing various operations using a processor. The simulation engine may receive simulated sensor data corresponding with a first synthetic object in a simulated three-dimensional (3D) environment at operation 602. For example, the first synthetic object may include a vehicle, which may include an outer contour including a body frame, windows coupled to the body frame, tail lights positioned on back of the body frame and head lights positioned on front of the body frame, tires positioned on bottom of the body frame, and seats inside the body frame.

In some embodiments, the body frame may be configured to represent a simulated surface formed of metal e.g., a metal vehicle body.

In some embodiments, the seat covers may be configured to represent a simulated seat formed of various materials, e.g., fabrics or leather covers.

In some embodiments, the tires may be configured to represent a simulated surface formed of plastic, e.g. dark color rubbers.

In some aspects, the synthetic object may also include bikes that may have various parts with different reflectivity.

The simulation engine may also identify an object type corresponding with the first synthetic object based on a location of the first synthetic object in the simulated 3D environment at operation 606. For example, the simulation can identify the seats of the vehicle based upon the location of the seats in combination with the returned intensity value.

The simulation engine may further associate a first intensity value with the simulated sensor data based on the object type for the first synthetic object at operation 610. For example, the first intensity value for returned signal 406A, 406B or 410, as shown in FIG. 4, may vary with the object type. The synthetic objects may have different reflectivity such that the returned signal may have different intensity values. For example, a returned signal from the body frame outside the vehicle has a higher intensity value than that of the returned signal from the seats inside the vehicle.

The simulation engine may also receive simulated sensor data corresponding with a second synthetic object in the simulated 3D environment, identify an object type corresponding with the second synthetic object based on a location of the second synthetic object in the 3D environment, and associate a second intensity value with the simulated sensor data based on the object type for the second synthetic object. The second intensity value is different from the first intensity value. For example, different parts of the synthetic object have different reflectivity, which results in different returned intensity values.

In some embodiments, the first synthetic object represents a semi-transparent object in the simulated 3D environment, such as a window of a vehicle.

In some embodiments, the first synthetic object represents a non-transparent object in the simulated 3D environment, such as a body frame of the vehicle.

In some embodiments, the first synthetic object represents a retro-reflector in the simulated 3D environment, such as a tail light or head light of the vehicle.

In some embodiments, the simulated sensor data includes simulated Light Detection and Ranging (LiDAR) sensor data. In some embodiments, the first intensity value is based on raw LiDAR data collected from one or more real world objects. For example, the first intensity value varies with the object type.

In some embodiments, the computer-implemented method for an autonomous vehicle is provided. The raw data from LiDAR sensors include light intensities returned from synthetic objects and 3D locations associated with the synthetic objects.

In some embodiments, the simulation engine may add a reflector to each of the synthetic objects in the LiDAR simulations. For example, the synthetic object may be a vehicle, which may include various parts, such as body frame, tail lights and head lights, windows, tires, and seats, among others. Each part of the vehicle may be added or labeled with a reflector. For example, the tail lights and head lights may have a reflectivity of 150/256 to 200/256, a chrome plating of the vehicles may have a reflectivity of about 200/256 or higher reflectivity, the mirrors of the vehicles have a full reflectivity of 256/256, the average paint of body frame may have a reflectivity of 50/256, the tires may have a reflectivity of 20/256, the windows may have a zero reflectivity, and the seats may have a reflectivity of 30/256.

In some embodiments, the synthetic object is a pedestrian including skin, hair, clothes, among others. The skin may have a high reflectivity (e.g. 70%), while the hair may have a low reflectivity. The clothes may have a low reflectivity, which may vary with the type of material for the clothes, such as synthetic material or natural material (e.g. cotton). For example, the synthetic material such as polyester or nylon may have higher reflectivity than the natural material such as cotton.

In some embodiments, the synthetic object may also include environments, such as road, rain, or bushes, among others, which may also have various reflectivity. For example, the road may have a low reflectivity (e.g. 20%). The bushes with leaves may have a high reflectivity (e.g. 80%). The rain may be simulated by adding noises to simulations such that the point clouds are less clear than without rain.

In some embodiments, the simulation engine may also add light transmission through the synthetic objects having an optical semi-transparency or optical transparency in LiDAR simulations.

In some embodiments, the simulated light intensities returned back to the simulated LiDAR sensors include a primary reflection and a secondary reflection from the synthetic objects. In some embodiments, the simulation engine may also receive secondary reflections reflected from the synthetic objects and the 3D locations corresponding to the secondary reflections and identify the synthetic objects based upon intensities of the secondary reflections and the 3D locations.

In some embodiments, the synthetic objects may include a first portion having a first light reflectivity and a first incident angle and a second portion having a second light reflectivity and a second incident angle. The first portion is at least one semi-transparent or transparent portion. The second reflectivity of the second portion is higher than the first reflectivity of the first portion. The first portion of the synthetic objects having an optical semi-transparency or optical transparency may include a window, such as a glass, among others. The simulation engine may identify the synthetic objects based upon the first light reflectivity and the incident angle of the first portion and the second reflectivity and the second incident angle of the second portion. In some embodiments, the simulation engine may also visualize the synthetic objects defined by point clouds based upon the LiDAR simulations.

Figure 7:
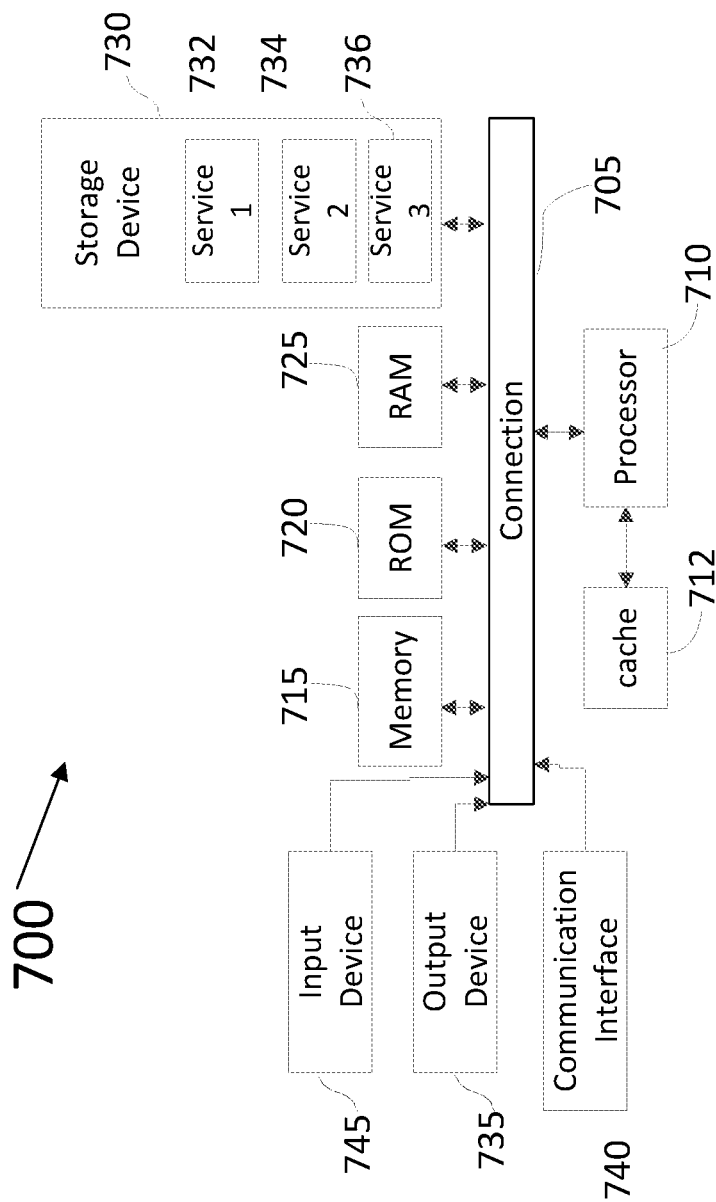
FIG. 7 illustrates an example processor-based system with which some aspects of the subject technology can be implemented.

FIG. 7 shows an example of computing system 700, which can be for example any computing device making up internal computing system 110, remote computing system 150, (potential) passenger device executing rideshare app 170, or any component thereof in which the components of the system are in communication with each other using connection 705. Connection 705 can be a physical connection via a bus, or a direct connection into processor 710, such as in a chipset architecture. Connection 705 can also be a virtual connection, networked connection, or logical connection.

In some embodiments, computing system 700 is a distributed system in which the functions described in this disclosure can be distributed within a datacenter, multiple data centers, a peer network, etc. In some embodiments, one or more of the described system components represents many such components each performing some or all of the function for which the component is described. In some embodiments, the components can be physical or virtual devices.

Example system 700 includes at least one processing unit (CPU or processor) 710 and connection 705 that couples various system components including system memory 715, such as read-only memory (ROM) 720 and random access memory (RAM) 725 to processor 710. Computing system 700 can include a cache of high-speed memory 712 connected directly with, in close proximity to, or integrated as part of processor 710.

Processor 710 can include any general purpose processor and a hardware service or software service, such as services 732, 734, and 736 stored in storage device 730, configured to control processor 710 as well as a special-purpose processor where software instructions are incorporated into the actual processor design. Processor 710 may essentially be a completely self-contained computing system, containing multiple cores or processors, a bus, memory controller, cache, etc. A multi-core processor may be symmetric or asymmetric.

To enable user interaction, computing system 700 includes an input device 745, which can represent any number of input mechanisms, such as a microphone for speech, a touch-sensitive screen for gesture or graphical input, keyboard, mouse, motion input, speech, etc. Computing system 700 can also include output device 735, which can be one or more of a number of output mechanisms known to those of skill in the art. In some instances, multimodal systems can enable a user to provide multiple types of input/output to communicate with computing system 700. Computing system 700 can include communications interface 740, which can generally govern and manage the user input and system output. There is no restriction on operating on any particular hardware arrangement, and therefore the basic features here may easily be substituted for improved hardware or firmware arrangements as they are developed.

Storage device 730 can be a non-volatile memory device and can be a hard disk or other types of computer readable media which can store data that are accessible by a computer, such as magnetic cassettes, flash memory cards, solid state memory devices, digital versatile disks, cartridges, random access memories (RAMs), read-only memory (ROM), and/or some combination of these devices.

The storage device 730 can include software services, servers, services, etc., that when the code that defines such software is executed by the processor 710, it causes the system to perform a function. In some embodiments, a hardware service that performs a particular function can include the software component stored in a computer-readable medium in connection with the necessary hardware components, such as processor 710, connection 705, output device 735, etc., to carry out the function.

For clarity of explanation, in some instances, the present technology may be presented as including individual functional blocks including functional blocks comprising devices, device components, steps or routines in a method embodied in software, or combinations of hardware and software.

Any of the steps, operations, functions, or processes described herein may be performed or implemented by a combination of hardware and software services or services, alone or in combination with other devices. In some embodiments, a service can be software that resides in memory of a client device and/or one or more servers of a content management system and perform one or more functions when a processor executes the software associated with the service. In some embodiments, a service is a program or a collection of programs that carry out a specific function. In some embodiments, a service can be considered a server. The memory can be a non-transitory computer-readable medium.

In some embodiments, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer-readable media. Such instructions can comprise, for example, instructions and data which cause or otherwise configure a general purpose computer, special purpose computer, or special purpose processing device to perform a certain function or group of functions. Portions of computer resources used can be accessible over a network. The executable computer instructions may be, for example, binaries, intermediate format instructions such as assembly language, firmware, or source code. Examples of computer-readable media that may be used to store instructions, information used, and/or information created during methods according to described examples include magnetic or optical disks, solid-state memory devices, flash memory, USB devices provided with non-volatile memory, networked storage devices, and so on.

Devices implementing methods according to these disclosures can include hardware, firmware and/or software, and can take any of a variety of form factors. Typical examples of such form factors include servers, laptops, smartphones, small form factor personal computers, personal digital assistants, and so on. The functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

What is claimed is:

1. A computer-implemented method for simulating sensor data acquisition, the method comprising:
receiving simulated sensor data corresponding with a first synthetic object in a simulated three-dimensional (3D) environment;

receiving simulated sensor data corresponding with a second synthetic object in the simulated 3D environment;

identifying an object type corresponding with the first synthetic object based on a location of the first synthetic object in the simulated 3D environment;

identifying an object type corresponding with the second synthetic object based on a location of the second synthetic object in the 3D environment, including the location of the second synthetic object relative to the location of the first synthetic object;

associating a first intensity value with the simulated sensor data corresponding with the first synthetic object based on the object type for the first synthetic object; and associating a second intensity value with the simulated sensor data corresponding with the second synthetic object based on the object type for the second synthetic object, wherein the second intensity value is different from the first intensity value.

2. The computer-implemented method of claim 1, wherein the first synthetic object represents a semi-transparent object in the simulated 3D environment.

3. The computer-implemented method of claim 2, wherein the second synthetic object represents a non-transparent object in the simulated 3D environment.

4. The method of claim 3, wherein the object type of the second synthetic object is identified based on the first synthetic object being between a location of a simulated sensor, associated with the simulated sensor data corresponding to the first synthetic object and the second synthetic object, and the location of the second synthetic object.

5. The method of claim 4, wherein the second intensity value associated with the simulated sensor data corresponding with the second synthetic object is further based on one or more of an object orientation of the second synthetic object and an angle of incidence of a signal from the simulated sensor with the second synthetic object.

6. The computer-implemented method of claim 1, wherein the second synthetic object represents a retro-reflector in the simulated 3D environment.

7. The computer-implemented method of claim 1, wherein the first intensity value is based on raw LiDAR data collected from one or more real world objects.

8. A non-transitory computer readable medium comprising instructions, the instructions, when executed by a computing system, cause the computing system to perform operations comprising:

receiving simulated sensor data corresponding with a first synthetic object in a simulated three-dimensional (3D) environment, receiving simulated sensor data corresponding with a second synthetic object in the simulated 3D environment, associating a first intensity value with the simulated sensor data corresponding with the first synthetic object based on an object type for the first synthetic object; and associating a second intensity value with the simulated sensor data corresponding with the second synthetic object based on the object type for the second synthetic object and a location of the second synthetic object in the 3D environment, including the location of the second synthetic object relative to a location of the first synthetic object, wherein the second intensity value is different from the first intensity value.

9. The medium of claim 8, wherein the first synthetic object represents a semi-transparent object in the simulated 3D environment.

10. The medium of claim 9, wherein the second synthetic object represents a non-transparent object in the simulated 3D environment.

11. The medium of claim 10, wherein the second intensity value associated with the simulated sensor data corresponding with the second synthetic object is further based on one or more of an object orientation of the second synthetic object and an angle of incidence of a signal from the simulated sensor with the second synthetic object.

12. The medium of claim 8, wherein the second synthetic object represents a retro-reflector in the simulated 3D environment.

13. The medium of claim 8, wherein the simulated sensor data comprises simulated LiDAR sensor data.

14. The medium of claim 8, wherein the first intensity value is based on raw LiDAR data collected from one or more real world objects.

15. A system for simulating sensor data acquisition, the system comprising:

one or more processors; and a non-transitory computer readable medium comprising instructions stored therein, the instructions, when executed by the one or more processors, cause the processors perform operations comprising:

receiving simulated sensor data corresponding with a first synthetic object in a simulated three-dimensional (3D) environment, receiving simulated sensor data corresponding with a second synthetic object in the simulated 3D environment, identifying an object type correspond with the first synthetic object based on a location of the first synthetic object in the simulated 3D environment, identifying an object type corresponding with the second synthetic object based on a location of the second synthetic object in the 3D environment, including the location of the second synthetic object relative to the location of the first synthetic object;

associating a first intensity value with the simulated sensor data corresponding with the first synthetic object based on the object type for the first synthetic object, and associating a second intensity value with the simulated sensor data corresponding with the second synthetic object based on the object type for the second synthetic object, wherein the second intensity value is different from the first intensity value.

16. The system of claim 15, wherein the first synthetic object represents a semi-transparent object in the simulated 3D environment.

17. The system of claim 7, wherein the second synthetic object represents a non-transparent object in the simulated 3D environment.

18. The system of claim 17, wherein the object type of the second synthetic object is identified based on the first synthetic object being between a location of a simulated sensor, associated with the simulated sensor data corresponding to the first synthetic object and the second synthetic object, and the location of the second synthetic object, and wherein the second intensity value associated with the simulated sensor data corresponding with the second synthetic object is further based on one or more of an object orientation of the second synthetic object and an angle of incidence of a signal from the simulated sensor with the second synthetic object.

19. The system of claim 15, wherein the second synthetic object represents a retro-reflector in the simulated 3D environment.

20. The system of claim 15, wherein the simulated sensor data comprises simulated LiDAR sensor data, wherein the first intensity value is based on raw LiDAR data collected from one or more real world objects.

* * * * *